United States Patent
Watanabe

[11] Patent Number: 6,124,144
[45] Date of Patent: Sep. 26, 2000

[54] METAL ELECTRODE MASK IN A METHOD OF FAULT FAILURE ANALYSIS AND CHARACTERIZATION OF SEMICONDUCTOR DEVICES

[75] Inventor: Hiroshi Watanabe, Machida, Japan

[73] Assignee: Canon Kabushiki Kaisha, Tokyo, Japan

[21] Appl. No.: 09/231,654

[22] Filed: Jan. 15, 1999

[30] Foreign Application Priority Data

Jan. 19, 1998 [JP] Japan .................................. 10-007496

[51] Int. Cl.⁷ ...................................................... G01R 31/26
[52] U.S. Cl. ................................................. 438/18; 438/16
[58] Field of Search .................................. 438/14, 15, 16, 438/17, 18

[56] References Cited

U.S. PATENT DOCUMENTS

| | | |
|---|---|---|
| 5,504,340 | 4/1996 | Mizumura et al. . |
| 5,561,293 | 10/1996 | Penget et al. . |
| 5,760,892 | 6/1998 | Koyama . |
| 5,943,346 | 8/1999 | Sanada . |

*Primary Examiner*—Chandra Chaudhari
*Assistant Examiner*—Evan Pert
*Attorney, Agent, or Firm*—Fitzpatrick, Cella, Harper & Scinto

[57] ABSTRACT

With regard to a method for fault or failure analysis of a fault or failure phenomenon caused by a leakage current, or a method for characterization of semiconductor devices, pre-treatment is conducted to check a leakage point of the semiconductor devices covered by a conductive film. The pre-treatment includes a step of forming a metal film having a lower etching rate than a conductive film over a part of the conductive film. The metal film is used as a mask for forming a nonetching area on the conductive film, when the conductive film is etched. The metal film is also used as an electrode pad to be applied a potential at the characterization of the semiconductor devices.

8 Claims, 9 Drawing Sheets

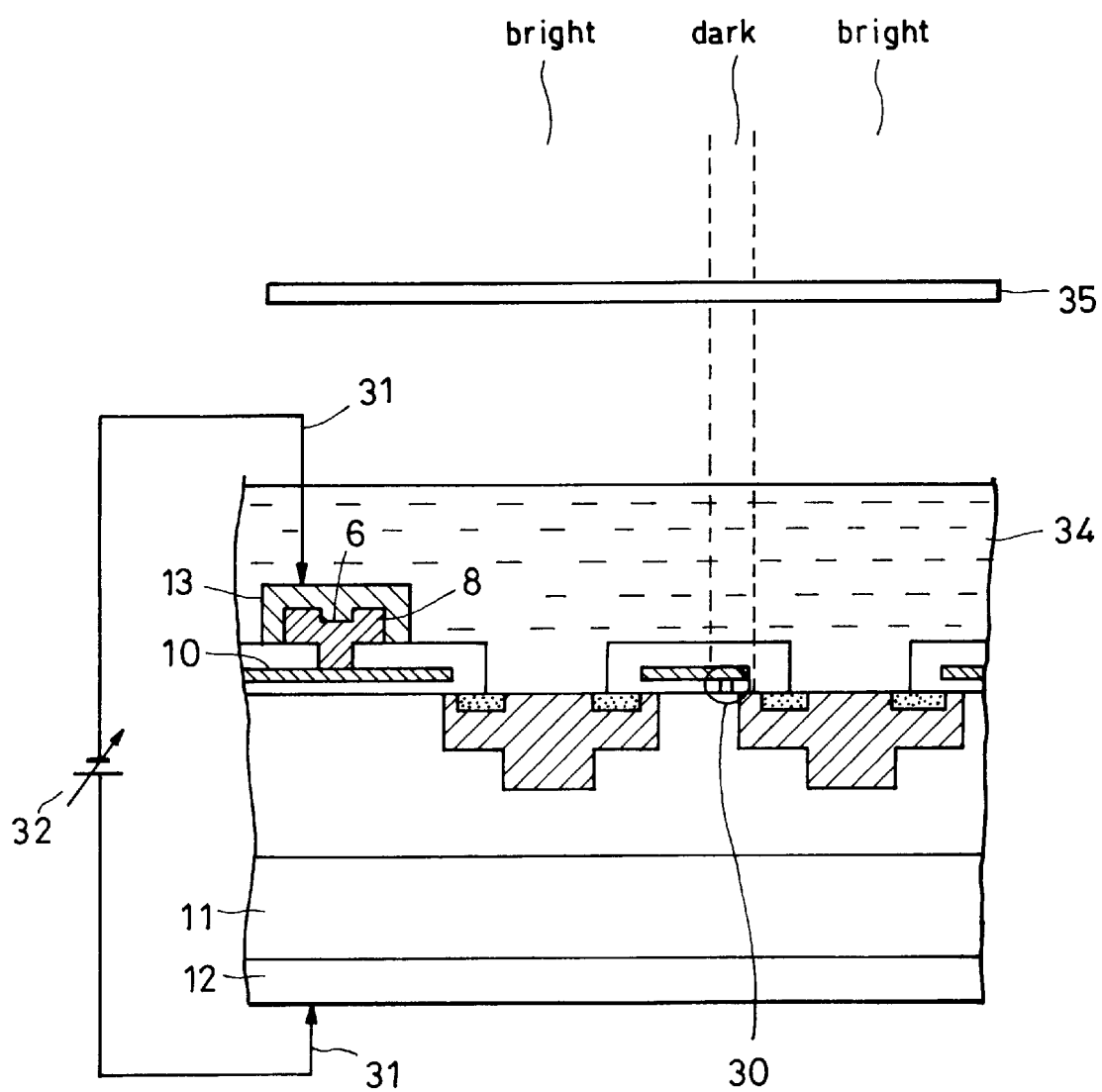

METAL ELECTRODE MASK IN A METHOD OF FAULT FAILURE ANALYSIS AND CHARACTERIZATION OF SEMICONDUCTOR DEVICES

BACKGROUND OF THE INVENTION

1. Field of the Invention

The present invention relates to a method for fault or failure analysis and a method for characterization of semiconductor devices. Particularly the present invention relates to a method for checking a leakage point with regard to a fault or failure with a leakage current in semiconductor components and relates to a measuring method for static characteristics and the like of devices.

2. Description of the Related Art

With regard to a fault or failure phenomenon of a semiconductor device with a leakage current, methods for checking the leakage point include hot electron analysis and an emission microscopic method (hereinafter referred to as an EMS method) which use a micro-luminescent phenomenon caused by a leakage current; and a liquid crystal analysis and a liquid crystal coating method which uses an exothermic reaction caused by the leakage current.

First, a resin packaging a semiconductor device is partially decomposed by a reagent such as fuming nitric acid, so that only a semiconductor chip located at the interior of the apparatus is exposed. This procedure does not change the electrical characteristics of the chip, because only the resin used for packaging the chip is removed.

Next, when the micro-luminescent phenomenon is used, a potential is applied to terminals of the semiconductor device. An abnormal luminescence occurs caused by the leakage current at the fault or failure point, so that the leakage point can be checked by observing the micro-luminescence. On the other hand, when the exothermic reaction caused by the leakage current is employed, a phase transition phenomenon of the liquid crystal applied on the chip occurring at a temperature above the transition point is used. Since the optical status of the liquid crystal changes at the leakage point, the leakage point can be checked by observing the point by a polarizing microscope.

However, the fault or failure analyses of a semiconductor device described above are carried out with difficulties in the case of a power-MOSFET in which a conductive wiring film covers substantially the entire surface of the chip. Furthermore, in a conventional semiconductor device, the leakage point may be located in an element immediately below an electrical power supply line having a relatively large linewidth of the conductive wiring film or a GND line in some cases. In such a case, the luminescence cannot be detected by the EMS method, because the conductive wiring film intercepts the light. In addition, with regard to the liquid crystal covering method, a significantly high current is required, resulting in the deterioration of the device.

Further, as a method of checking a leakage fault or failure of the semiconductor device covered with the conductive wiring film, an EMS observation is carried out from the rear surface of the chip by utilizing a phenomenon that the luminescent light caused by the leakage passes through a Si substrate. This method cannot, however, be applied to a semiconductor device in which electrodes are provided on the entire rear surface of the chip substrate such as a power-MOSFET.

SUMMARY OF THE INVENTION

Accordingly, it is an object of the present invention to provide a method for fault or failure analysis and a method for characterization of semiconductor devices in which an EMS method and a liquid crystal coating method can be used, even when a conductive film covers the semiconductor devices.

One aspect of the present invention is a method for fault or failure analysis of a semiconductor device caused by a leakage current including the steps of: forming a metal film having a lower etching rate than a conductive film on a part of the semiconductor device; etching the conductive film using the metal film as a mask for forming a nonetching area; and checking a leakage point by applying a predetermined potential to the metal film.

Another aspect of the present invention is a method for characterization of a semiconductor device, including the steps of: forming a metal film having a lower etching rate than a conductive film on a part of the semiconductor device; etching the conductive film using the metal film as a mask for forming a nonetching area; and characterizing the semiconductor device by applying a predetermined potential to the metal film.

The metal film may be made of a material having a lower etching rate than that of the conductive film. A high melting point metal such as tungsten, titanium, or molybdenum is preferred.

In accordance with the present invention, the metal film (for example, a tungsten film) having a lower etching rate than the conductive film is formed on a part of the conductive film which forms a wiring (for example, aluminum metals such as aluminum, Al—Cu, Al—Si, Al—Si—Cu, and Al—Ge, or copper metals such as Cu and Cu—Ge) using, for example, a focused ion beam system (an FIB system). The metal film is used as an etching mask during sample processing. Further, the metal film is used as an electrical pad in a mechanical probe method, when the leakage point is checked by an EMS method or a liquid crystal coating method, or when the characterization of the semiconductor device is conducted (for example, measuring the amplification factor and transconductance of a device such as a transistor).

A metal film such as a tungsten film having an area which allows a mechanical probe method is formed at a part of a conductive film which forms wiring, particularly formed on a contact section which puts the metal film as a lower wiring film in contact with a poly-Si film. And then, the conductive film is etched away by a reagent such as phosphoric acid, so that a device positioned at the lower conductive film can be optically observed.

The conductive film positioned immediately below the resulting metal film such as the tungsten film is not etched, because the metal film functions as a mask. Additionally, since the metal film is formed on the contact section, the metal film is electrically connected with the lower wiring film. Therefore, the metal film is used as an electrode pad in the EMS method or the liquid crystal coating method, so that the check of the leakage point or characterization of the device can be conducted.

BRIEF DESCRIPTION OF THE DRAWINGS

FIG. 15 is a schematic diagram showing a liquid crystal coating method.

DESCRIPTION OF THE PREFERRED EMBODIMENT

Figure 1:
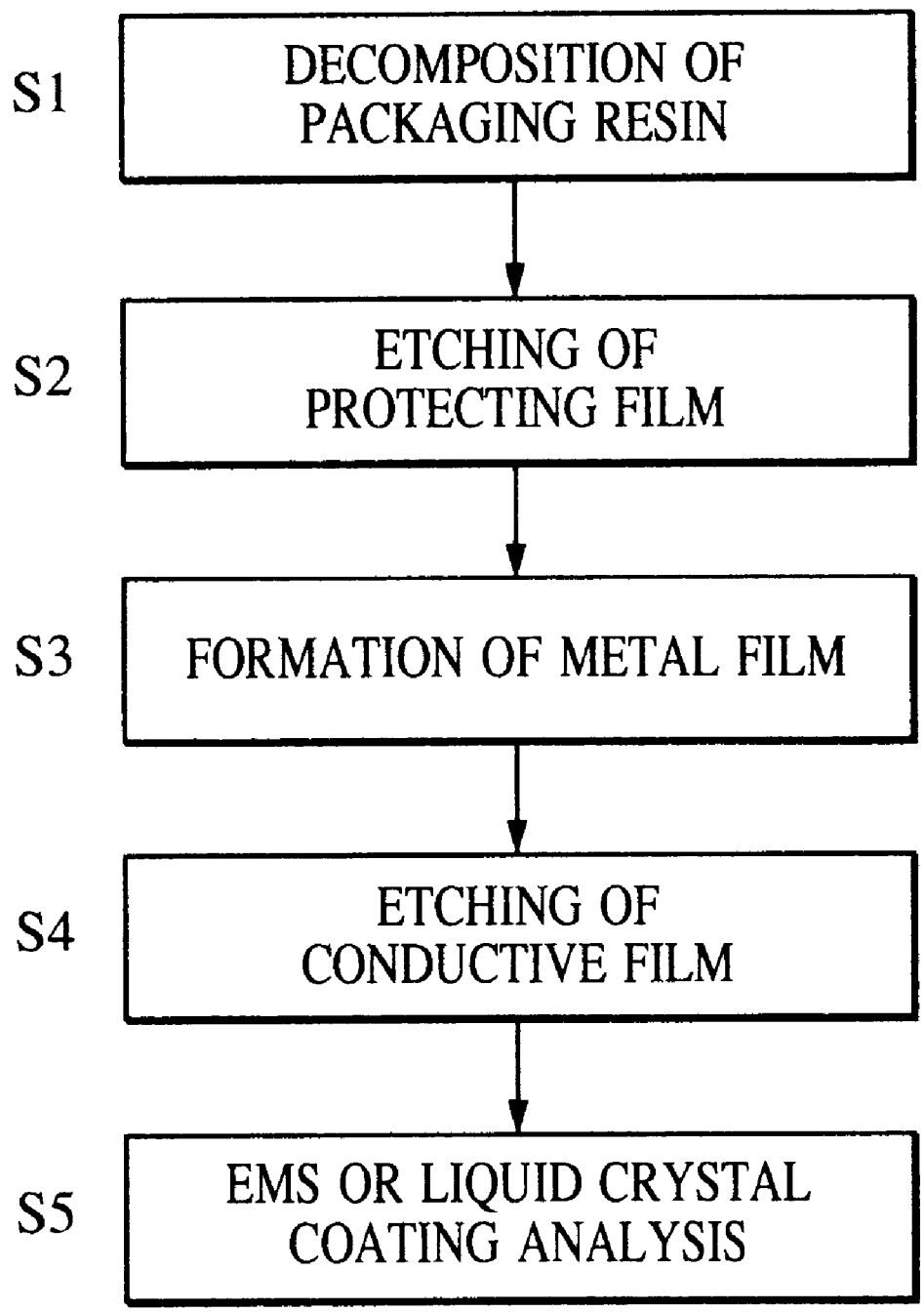
FIG. 1 is a flow chart of a method for fault or failure analysis and a method for characterization of semiconductor devices in accordance with the present invention.

FIG. 1 is a flow chart of a method for fault or failure analysis and a method for characterization of semiconductor devices in accordance with the present invention. First, a semiconductor device such as a power-MOSFET which malfunctions is prepared. A packaging resin of the power-MOSFET is decomposed by a reagent such as fuming nitric acid (Step 51). A protecting film is removed by etching (Step 52). Next, a metal film such as a tungsten film is selectively formed by, for example, an FIB system (Step 53), and then, a lower conductive film such as an aluminum film is etched away using the metal film as an etching mask (Step 54).

In an EMS method, a predetermined potential is applied to the metal film of the resulting sample and a luminescent light caused by a leakage current is observed. In a liquid crystal coating method, a liquid crystal is applied on the exposed conductive film and a change in the optical status of the liquid crystal caused by an exothermic reaction is observed (Step 55).

First Embodiment

The present invention is applied to the check of a fault or failure leakage point between a gate and a drain of a power-MOSFET in the first embodiment.

Figure 2:
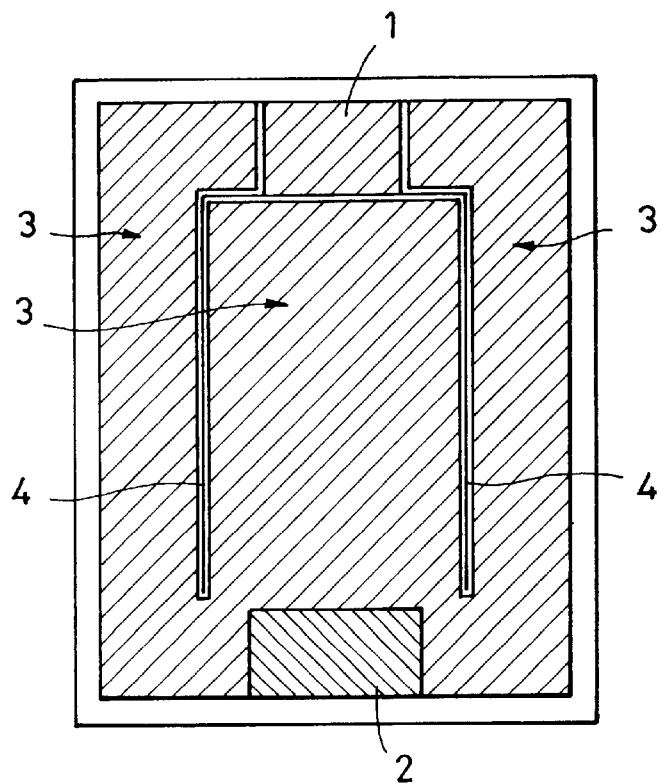
FIG. 2 is an entire plan view of a power-MOSFET chip to be tested according to a first embodiment of the present invention.
Figure 3:
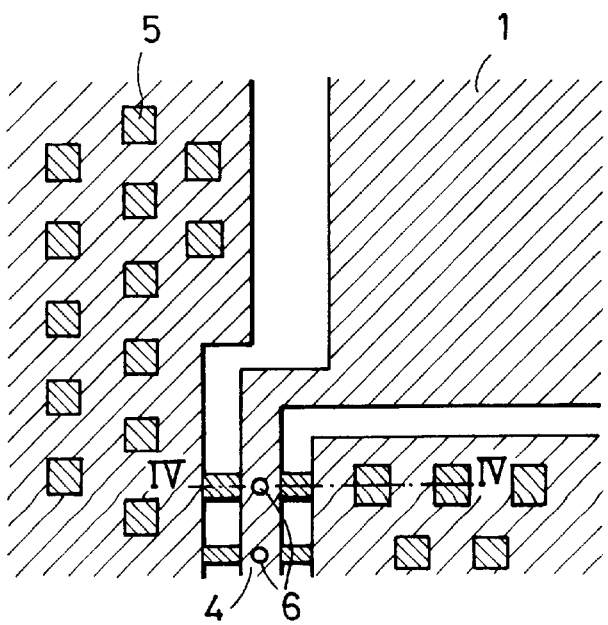
FIG. 3 is a partly enlarged view of FIG. 2.
Figure 4:
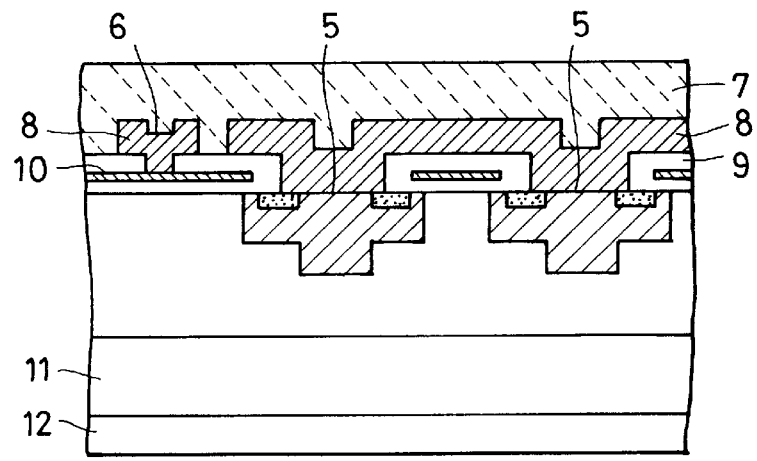
FIG. 4 is a cross-sectional view taken from line IV—IV of FIG. 3.

First, the power-MOSFET is described. FIG. 2 is an entire plan view of a power-MOSFET chip. FIG. 3 is a partly enlarged view of FIG. 2. FIG. 4 is a cross-sectional view taken from line IV—IV of FIG. 3.

In FIGS. 2 and 3, numeral 1 indicates a gate electrode pad, numeral 2 indicates a source electrode pad, numeral 3 indicates a group of basic cells of FET, and numeral 4 indicates a bus line which transmits a signal from the electrode pad 1 to a gate electrode of each basic cell.

Further, numeral 5 in the FIGS. 3 and 4 indicates a basic cell. The power-MOSFET comprises several hundreds of the basic cells having the same configuration (the basic cells are electrically connected in parallel).

In FIG. 4, numeral 7 indicates a protecting film and numeral 8 indicates an aluminum wiring film being used for a source electrode and the bus line 4 which substantially covers the entire surface of a chip. Numeral 9 indicates an interlayer insulating film, and numeral 10 indicates a poly5 Si film as a gate electrode. In addition, FIG. 4 is a cross-sectional view taken from line IV—IV of FIG. 3. The poly-Si film 10 is commonly connected (electrically connected) to all of the basic cells. Numeral 6 indicates a contact hole section which connects the aluminum wiring film 8 being used as the bus line 4 to the poly-Si film 10 which is the gate electrode. Numeral 11 indicates a drain layer of the power-MOSFET, and numeral 12 indicates a drain electrode on the rear surface of the chip, and is connected to an external terminal.

Next, the steps for treating the power-MOSFET as shown in FIG. 1 will be described with reference to FIGS. 4, 5, 6, and 7.

Figure 5:
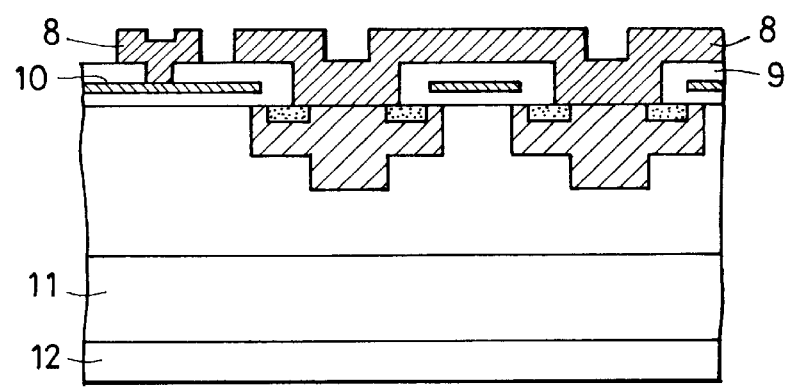
FIG. 5 is a cross-sectional view after removing a protecting film in FIG. 4.

The protecting film (an insulating film) 7 which covers the chip is wet-etched away and the aluminum wiring film (the source electrode) 8 is exposed. FIG. 5 shows the power-MOSFET in the exposed state.

Figure 6:
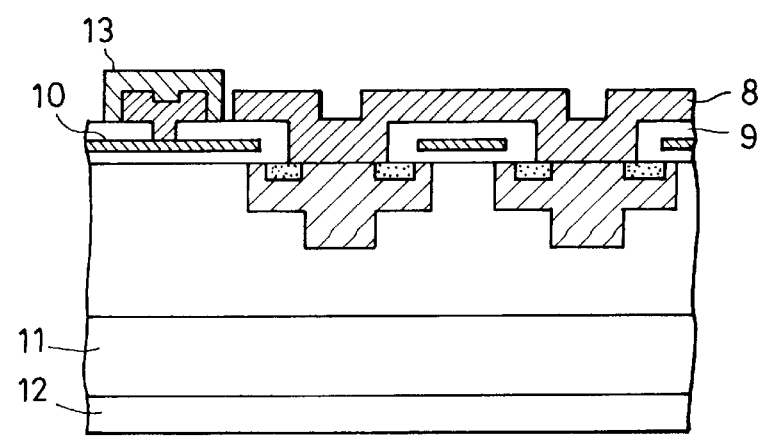
FIG. 6 is a cross-sectional view after forming a tungsten film in FIG. 5.

Next, as shown in FIG. 6, a tungsten film 13 is formed over the first contact hole section 6 conducting signals from the gate electrode pad 1 to each cell group using the FIB system. The tungsten film 13 simultaneously functions as an electrode pad providing a potential by a mechanical probe method. The size of the tungsten film 13 is generally 15 $\mu$m by 15 $\mu$m.

Figure 7:
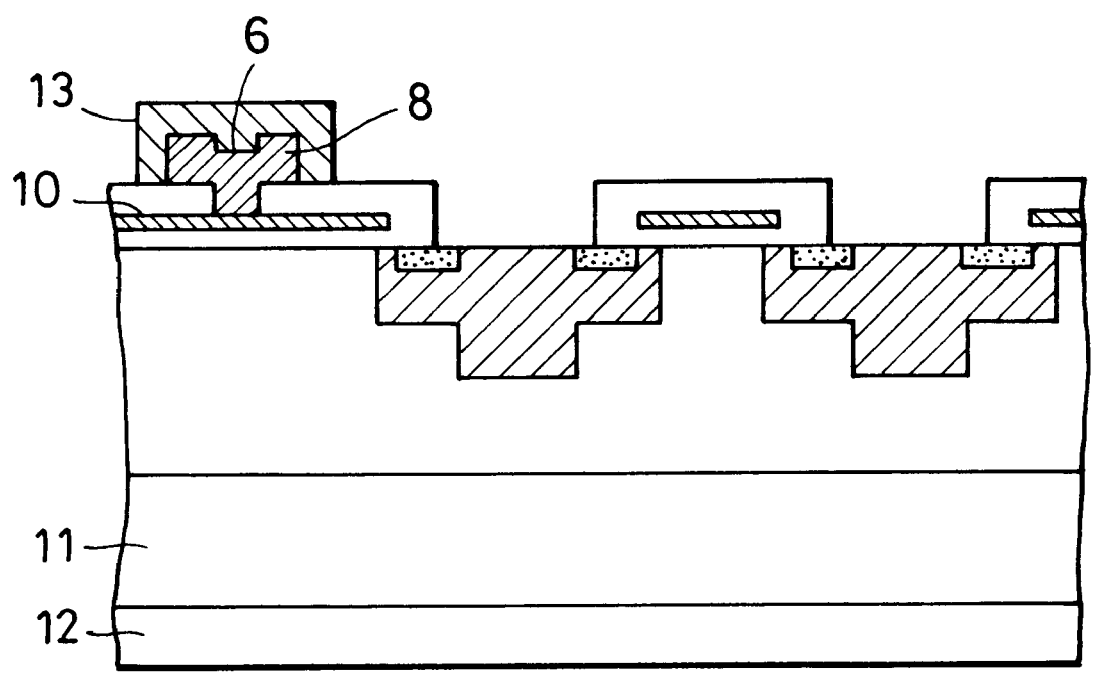
FIG. 7 is a cross-sectional view of the first embodiment to be tested in accordance with the present invention after removing an aluminum film.

Then, the aluminum wiring film 8 which covers the entire surface of the chip is wet-etched by phosphoric acid. The state after removing the aluminum wiring film 8 is shown in FIG. 7. The formed tungsten film 13 functions as a mask, so that the aluminum wiring film 8 remains without being etched away. Further, since the tungsten film 13 is formed over the contact hole section 6, the tungsten film 13 is in ohmic contact with the poly-Si film 10 via the aluminum wiring film 8.

Then, different potentials are applied to the drain electrode 12 and the tungsten film 13, and a leakage current is applied to a fault or failure point. A predetermined potential is applied to the drain electrode 12 from the external terminal which is directly connected to the rear surface of the chip. Furthermore, a predetermined potential is applied to the tungsten film 13 connected to the gate electrode by the mechanical probe method, in which the potential applied to the tungsten film 13 is different from the potential applied to the external terminal.

Figure 14:
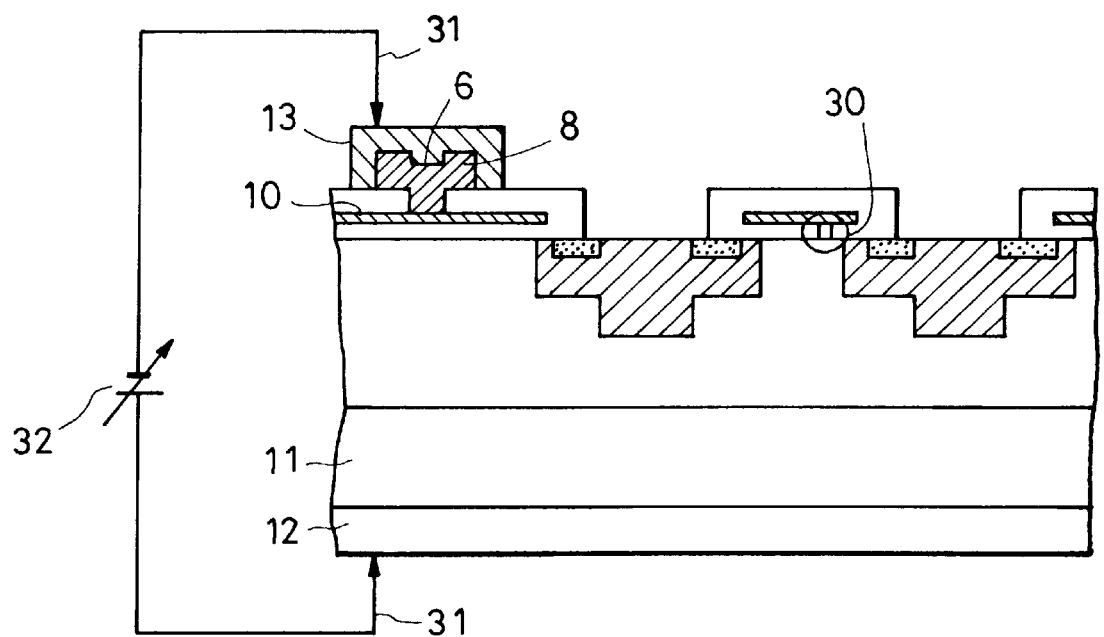
FIG. 14 is a schematic diagram showing a method for checking a leakage point by an EMS method.

FIG. 14 is a schematic diagram showing a method for checking a leakage point by an EMS method.

A pair of probes 31 are brought into contact with the tungsten film 13 and the drain electrode 12, and a voltage of several to several tens volts is applied by a source of direct voltage 32.

In FIG. 14, when a leakage due to a pinhole or the like at the interlayer insulating film 9 arises in an area represented by reference numeral 30, a current flows through the leakage point to cause luminescence.

The luminescent point can be found by observing the semiconductor device from above, so that the leakage point can be checked.

Since the aluminum wiring film 8 which intercepts a micro-luminescent light is removed other than at the tungsten film forming portion in this embodiment, the leakage point can be checked by the EMS method and a luminescent phenomenon caused by the leakage current can be observed.

FIG. 15 is a schematic diagram showing a liquid crystal coating method.

As shown in FIG. 15, after the tungsten film 13 is formed and the aluminum wiring film 8 is etched, liquid crystal 34 is applied thereon.

A voltage is applied to the tungsten film 13 and the drain electrode 12 by the source of direct voltage 32 the same as the EMS method. When an exothermic reaction is caused by a current which flows through the leakage point, a phase transition phenomenon of the liquid crystal on the leakage point partially occurs.

When the optical state of the liquid crystal 34 is observed through a polarizing lens 35, only the area above the leakage point 30 is darker (or brighter) than the other area (that is, the area in which no leakage occurs). Thus, the leakage point can be checked.

In addition, when characteristics of a transistor are evaluated, the probes are brought into contact with source, drain, and gate terminals. Then, a change in a current which flows between the source and drain terminals is evaluated relative to a voltage therebetween, while the gate voltage is varied.

Second Embodiment

The present invention is applied to a fault or failure point caused by a leakage current in semiconductor integrated circuit devices having two aluminum wiring films in the second embodiment.

Figure 8:
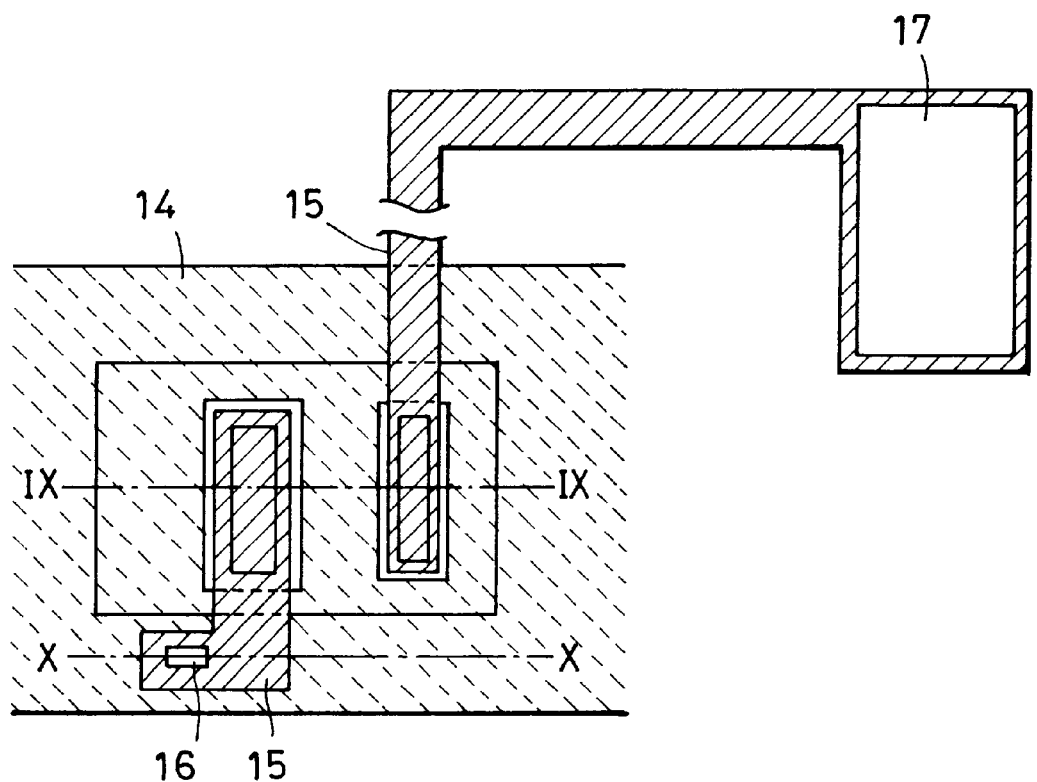
FIG. 8 is a partial plan view of a semiconductor integrated circuit to be tested according to a second embodiment of the present invention.
Figure 9:
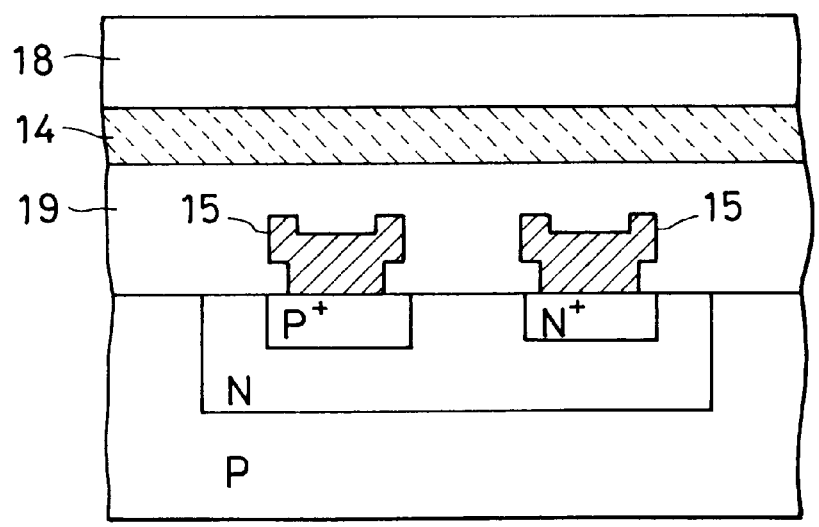
FIG. 9 is a cross-sectional view taken from line IX—IX of FIG. 8.
Figure 10:
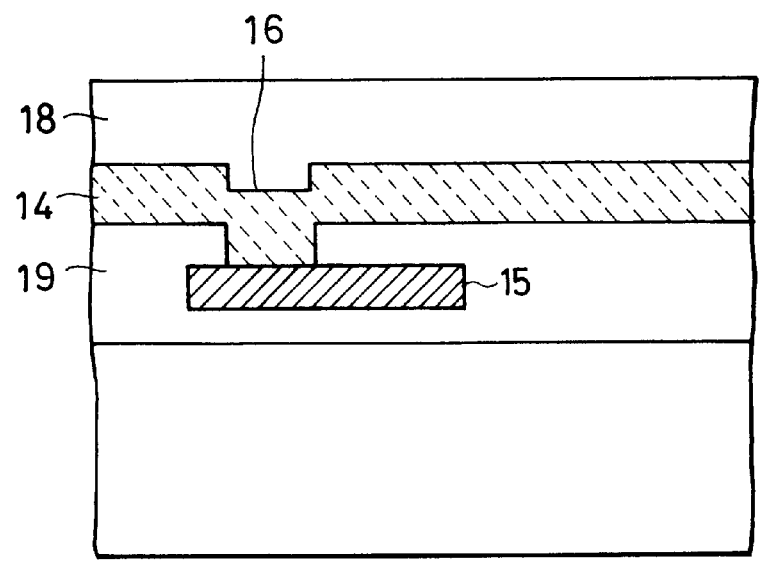
FIG. 10 is a cross-sectional view taken from line X—X of FIG. 8.

First, the semiconductor integrated circuit device having the two aluminum wiring films in accordance with the present invention is described. FIG. 8 is a partial plan view of a semiconductor integrated circuit device in accordance with the present invention. FIG. 9 is a cross-sectional view taken from line IX—IX of FIG. 8. FIG. 10 is a cross-sectional view taken from line X—X of FIG. 8.

In these figures, numeral 14 indicates an upper aluminum wiring film (in other words, a conducting layer), used as a GND line on the circuit. Numeral 15 indicates a lower aluminum wiring film. As shown in FIGS. 8, 9, and 10, the semiconductor integrated circuit device has a configuration in which the upper aluminum wiring film 14 used as the ground (GND) line covers a device area.

Numeral 16 in FIGS. 8 and 10 indicates a contact section which puts the lower aluminum wiring film 15 in contact with the upper aluminum wiring film (the GND line) 14.

Further, numeral 18 in FIGS. 9 and 10 indicates a protecting film, and numeral 19 indicates an interlayer insulating film between the upper aluminum wiring film 14 and the lower aluminum wiring film 15.

In this embodiment, since a leakage current of the semiconductor integrated circuit device flows between the GND and a particular input pin, a tungsten film (numeral 20 in FIG. 11) is selectively formed over the contact section 16 using the FIB system after removing the protecting film 18 as in the first embodiment.

Figure 11:
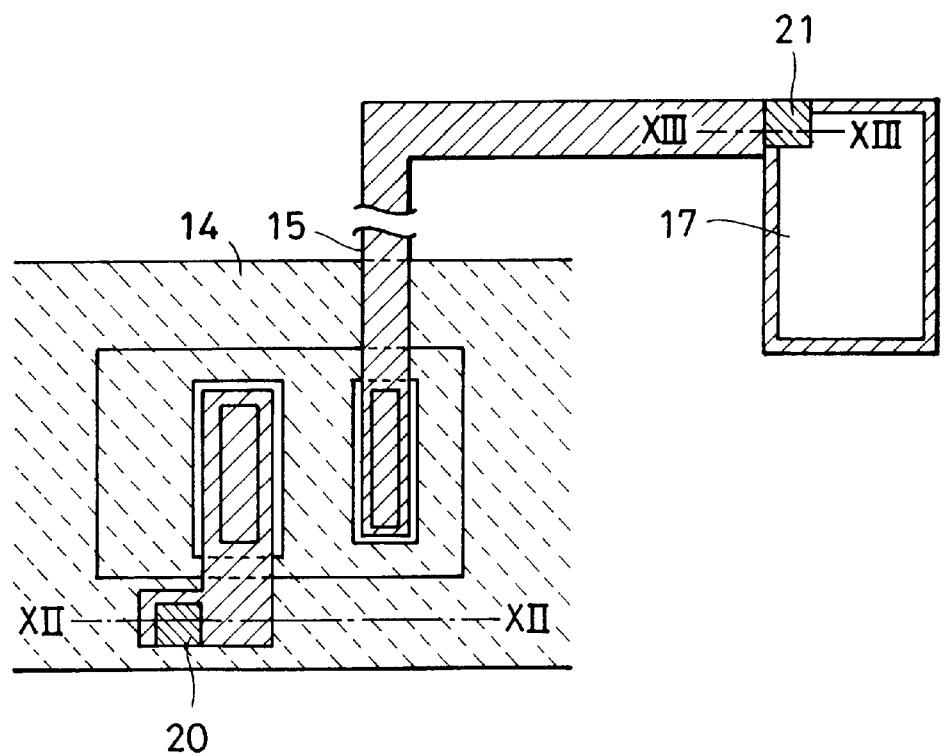
FIG. 11 is a plan view after forming a tungsten film in FIG. 8.

Additionally, another tungsten film, being indicated by numeral 21 in FIG. 11, is selectively formed at a part of a pad portion of the input pin (numeral 17 in FIG. 8) in which a leakage current is confirmed. The pad portion of the input pin 17 is connected to a device portion via the lower aluminum wiring film 15. In order for the pad portion 17 to be connected to an external pin, the pad portion 17 is an open area in which the protecting film 18, the upper aluminum wiring film 14, and the interlayer insulating film 19 between the upper aluminum wiring film 14 and the lower aluminum wiring film 15 are not provided. Therefore, when the upper aluminum wiring film 14 is etched, the open area is also etched, so that the open area should be masked.

Figure 12:
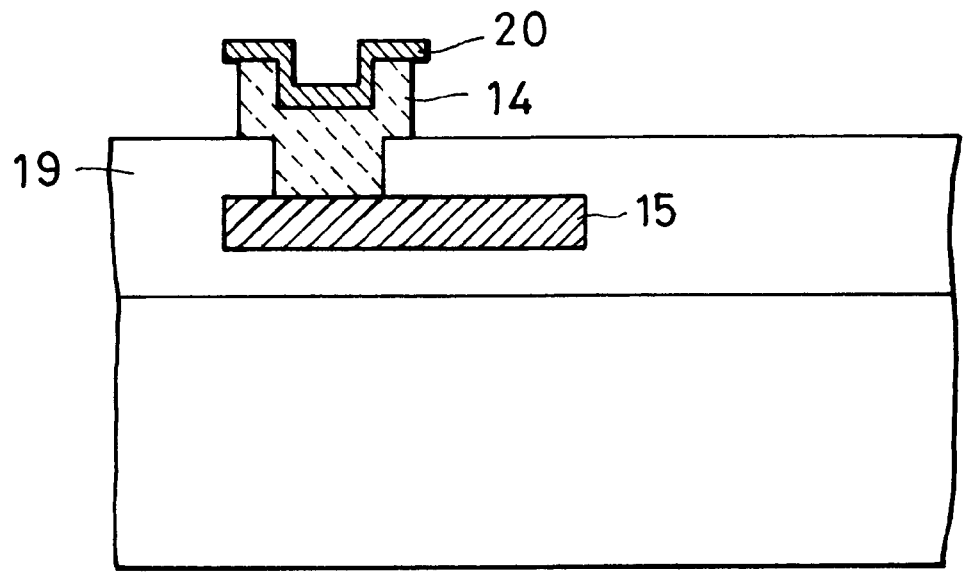
FIG. 12 is a cross-sectional view taken from line XII—XII of FIG. 11 after etching the upper aluminum wiring film.
Figure 13:
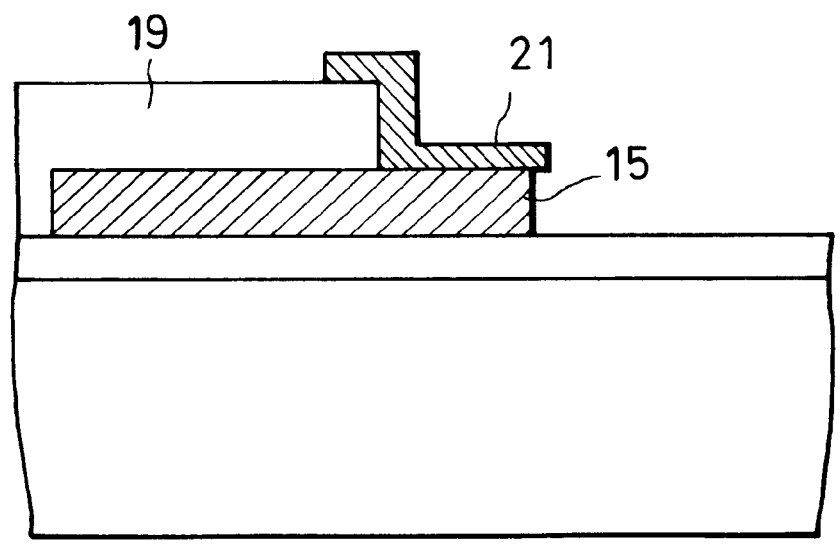
FIG. 13 is a cross-sectional view taken from line XIII—XIII of FIG. 11 after etching the upper aluminum wiring film.

Next, the upper aluminum wiring film 14 is removed by phosphoric acid after the formation of the tungsten film 20 and 21. FIGS. 12 and 13 show cross-sectional views taken from line XII—XII and line XIII—XIII of FIG. 11 after etching the upper aluminum wiring film 14, respectively.

Then, the leakage point is checked by the EMS method after different potentials are applied to the tungsten films 20 and 21 used as electrode pads by the mechanical probe method.

Since the upper aluminum wiring film 14 which intercepts a micro-luminescent light is also removed other than at the tungsten film forming portions in this embodiment, the leakage point can be checked by the EMS method and a luminescent phenomenon caused by the leakage current can be observed.

In addition, the above-described method is available not only for detecting a leakage current but also for measuring the amplification factor and transconductance of a device such as a transistor.

As described above, with regard to a fault or failure caused by a leakage current in semiconductor devices a leakage point can be checked in such a manner that a metal film such as a tungsten film is formed on a conductive film in which the metal film also functions as a mask forming a non-etching area in an etching step and as an electrode pad for applying a potential, even when the conductive film such as an aluminum wiring film covers a device portion.

What is claimed is:

1. A method for fault or failure analysis of a semiconductor device caused by a leakage current, comprising the steps of:

forming a localized metal film having a lower etching rate than a conductive film such that said metal film can serve as a test point and a mask on a part of said semiconductor device;

etching said conductive film using said metal film as the mask for forming a nonetching area; and checking a leakage point by applying a predetermined potential to said metal film acting as said test point.

2. A method for fault or failure analysis of a semiconductor device according to claim 1, wherein the check of said leakage point is conducted by observing localized microluminescence or by observing spatial changes in the optical state of a liquid crystal applied to said conductive film.

3. A method for fault or failure analysis of a semiconductor device according to claim 1 or 2, wherein said metal film comprises a high melting point metal.

4. A method for fault or failure analysis of a semiconductor device according to claim 1 or 2, wherein said metal film comprises at least one metal selected from the group consisting of tungsten, molybdenum, and titanium.

5. A method for characterization of a semiconductor device, comprising the steps of:

forming a localized metal film having a lower etching rate than a conductive film such that said metal film can serve as a test point and a mask on a part of said semiconductor device;

etching said conductive film using said metal film as the mask for forming a nonetching area; and characterizing said semiconductor device by applying a predetermined potential to said metal film acting as said test point.

6. A method for characterization of a semiconductor device according to claim 5, further comprising an analytical method for observing localized microluminescence or for observing spatial changes in the optical state of a liquid crystal applied to said conductive film.

7. A method for characterization of a semiconductor device according to claim 5 or 6, wherein said metal film comprises a high melting point metal.

8. A method for characterization of a semiconductor device according to claim 5 or 6, wherein said metal film comprises at least one metal selected from the group consisting of tungsten, molybdenum, and titanium.

* * * * *

UNITED STATES PATENT AND TRADEMARK OFFICE
CERTIFICATE OF CORRECTION

PATENT NO. : 6,124,144
DATED : September 26, 2000
INVENTOR(S) : HIROSHI WATANABE It is certified that error appears in the above-identified patent and that said Letters Patent is hereby corrected as shown below:

<u>COLUMN 1</u>:

Line 19, "use" should read --uses--.

<u>COLUMN 3</u>:

Line 38, "(Step 51)." should read --(Step S1).--;
    Line 39, "52)." should read --S2).--;
    Line 40, "(Step 53)," should read --(Step S3),--;
    Line 42, "(Step 54)." should read --(Step S4).--; and
    Line 50, "(Step 55)." should read --(Step S5).--.

Signed and Sealed this

First Day of May, 2001

Attest:

NICHOLAS P. GODICI

*Attesting Officer*    *Acting Director of the United States Patent and Trademark Office*